United States Patent
Gumaste et al.

(10) Patent No.: US 9,164,969 B1
(45) Date of Patent: Oct. 20, 2015

(54) METHOD AND SYSTEM FOR IMPLEMENTING A STREAM READER FOR EDA TOOLS

(75) Inventors: Udayan Anand Gumaste, San Jose, CA (US); Roland Ruehl, San Carlos, CA (US); Jeffrey Markham, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 783 days.

(21) Appl. No.: 12/569,482

(22) Filed: Sep. 29, 2009

(51) Int. Cl.
*G06F 17/22* (2006.01)

(52) U.S. Cl.
CPC .................................. *G06F 17/2247* (2013.01)

(58) Field of Classification Search
CPC .......... G06F 17/30; G06F 12/00; G06F 12/02
USPC ........................ 707/696, 711, 736, 741, 755
See application file for complete search history.

(56) References Cited

U.S. PATENT DOCUMENTS

| | | | | |
|---|---|---|---|---|
| 4,937,737 | A * | 6/1990 | Schwane et al. | 719/310 |
| 6,009,250 | A * | 12/1999 | Ho et al. | 716/52 |
| 6,011,911 | A | 1/2000 | Ho et al. | |
| 6,066,179 | A * | 5/2000 | Allan | 716/52 |
| 6,418,458 | B1 * | 7/2002 | Maresco | 718/103 |
| 7,243,039 | B1 * | 7/2007 | Suri et al. | 702/117 |
| 2002/0087618 | A1 * | 7/2002 | Bohm et al. | 709/201 |
| 2003/0108043 | A1 * | 6/2003 | Liao | 370/392 |
| 2004/0174276 | A1 * | 9/2004 | McCanne et al. | 341/50 |
| 2005/0146714 | A1 * | 7/2005 | Kitamura et al. | 356/237.2 |
| 2006/0212868 | A1 * | 9/2006 | Takayama et al. | 718/100 |
| 2007/0150895 | A1 * | 6/2007 | Kurland | 718/102 |
| 2007/0156379 | A1 * | 7/2007 | Kulkarni et al. | 703/14 |
| 2007/0204058 | A1 * | 8/2007 | Ladd et al. | 709/231 |
| 2008/0098403 | A1 * | 4/2008 | Balakrishnan et al. | 718/105 |
| 2009/0089531 | A1 * | 4/2009 | Johnson et al. | 711/170 |
| 2009/0254907 | A1 * | 10/2009 | Neary | 718/102 |
| 2011/0170091 | A1 * | 7/2011 | Chang et al. | 356/237.5 |

OTHER PUBLICATIONS

Solter et al., "Professional C++", Jan. 21, 2005, Wrox.*
Reich, A.J. et al., "OASIS vs. GDSII stream format efficiency," 23rd Annual BACUS Symposium on Photomask Technology, Sep. 9, 2003.
Grenon, B.J. et al., "Development of New Stream Format with GDSII Upper Compatibility and High-Compression Rate," 22nd Annual BACUS Symposium on Photomask Technology, Oct. 2002.

(Continued)

*Primary Examiner* — Rehana Perveen
*Assistant Examiner* — Huen Wong
(74) *Attorney, Agent, or Firm* — Vista IP Law Group, LLP

(57) ABSTRACT

Disclosed is a method, system, and computer program product for implementing efficient access to stream data. The present approach implements a stream reader that supports either reading the entire layout (e.g., loading the contents of the user-specified top cell and all its progeny) into memory, or just a portion of it (e.g., loading only the contents of the user-specified top cell and its progeny that overlapped a user-specified bounding box). Some approaches provide a mechanism to implement parallelized or multithreaded reads of the stream data.

30 Claims, 7 Drawing Sheets

(56) References Cited

OTHER PUBLICATIONS

Schulze, S.F. et al., "OASIS-based data preparation flows: progress report on containing data size explosion," Design and Process Integration for Microelectronic Manufacturing II, May 2004, pp. 149-157.

Chen, Y. et al., "Evaluation of the New OASIS Format for Layout Fill Compression," Proceedings of the 2004 11th IEEE International Conference on Electronics, Circuits and Systems, 2004. ICECS 2004., pp. 377-382.

* cited by examiner

METHOD AND SYSTEM FOR IMPLEMENTING A STREAM READER FOR EDA TOOLS

BACKGROUND

An integrated circuit (IC) has a large number of electronic components, such as transistors, logic gates, diodes, and wires that are fabricated by forming layers of different materials and of different geometric shapes on various regions of a silicon wafer.

Many phases of physical design may be performed with computer aided design (CAD) tools or electronic design automation (EDA) systems. To design an integrated circuit, a designer first creates high level behavior descriptions of the IC device using a high-level hardware design language. An EDA system typically receives the high level behavior descriptions of the IC device and translates this high-level design language into netlists of various levels of abstraction using a computer synthesis process. A netlist describes interconnections of nodes and components on the chip and includes information of circuit primitives, such as for example, transistors and diodes, their sizes and interconnections. An integrated circuit designer may use a set of layout EDA application programs to create a physical design of the IC from the logical design. The layout EDA application uses geometric shapes of different materials to create the various electrical components on an integrated circuit and to represent electronic and circuit IC components as geometric objects with varying shapes and sizes. The geometric information about the placement of the nodes and components onto the chip may be determined by a placement process and a routing process. The placement process is a process for placing electronic components or circuit blocks on the chip and the routing process is the process for creating interconnections between the blocks and components according to the specified netlist. After an integrated circuit designer has created an initial integrated circuit layout, the designer then verifies and optimizes the integrated circuit layout using a set of EDA testing and analysis tools. Verification may include, for example, design rule checking to verify compliance with rules established for various IC parameters.

The electronic design data is often stored in a "stream" format, which is a database file format that serially stores information about the different components and objects that are in the electronic design. GDSII ("Graphic Data System II") is a common stream format that has become a standard file format for storing layout information for electronic designs, which is structured as a binary file comprising geometric shapes, labels, and other information about the layout in hierarchical form. The data from the stream format, stream file or stream data (collectively referred to herein as either "stream file" or "stream data"), can be used to reconstruct all or part of the artwork to be used in sharing layouts, transferring artwork between different tools, or creating photomasks. Another common stream format for holding electronic designs is the OASIS ("Open Artwork System Interchange Standard") format, which is a binary format that provides an instruction set used to represent and express cell and chip level physical and mask layout data. The data within these stream-based formats is generally represented and organized on a cell-by-cell basis, with hierarchical references to other cells.

EDA tools often need to access the electronic design data that is stored in the stream-based formats. For example the process of performing design verification, modification, or review will require the ability to read the data that is stored in the GDSII or OASIS files. Many EDA tools implement data access by utilizing reading modules or tools that access and populate database structures with the contents of the stream files. An example database that can be used to hold this data is the OpenAccess database, the specifications of which are available from the Silicon Integration Initiative at www.si2.org. Once the database has been populated with the detailed design information, the EDA tool can then perform detailed analysis or visualization using the information in the database. Conventional tools that provide the functionality of reading data from the stream files typically operate very inefficiently. In part, this is because of the time that is required to perform conversion operations and to read the stream data into memory. Moreover, because of the sequential nature of the data for cells in a stream file, it is very difficult to parallelize the operations to read that data.

SUMMARY

Embodiments of the present invention provide a method, system, and computer program product for implementing efficient access to stream data. According to some embodiments, the present approach implements a stream reader that supports either reading the entire layout (e.g., loading the contents of the user-specified top cell and all its progeny) into memory, or just a portion of it (e.g., loading only the contents of the user-specified top cell and its progeny that overlapped a user-specified bounding box). Some embodiments provide a mechanism to implement parallelized or multithreaded reads of the stream data.

Other and additional objects, features, and advantages of the invention are described in the detailed description, figures, and claims.

DETAILED DESCRIPTION

Embodiments of the present invention provide a method, system, and computer program product for implementing access to stream files that efficiently allows access to the design data in the stream file. Either the sequential or multi-threaded approaches can be taken to implement embodiments of the invention.

Figure 1:
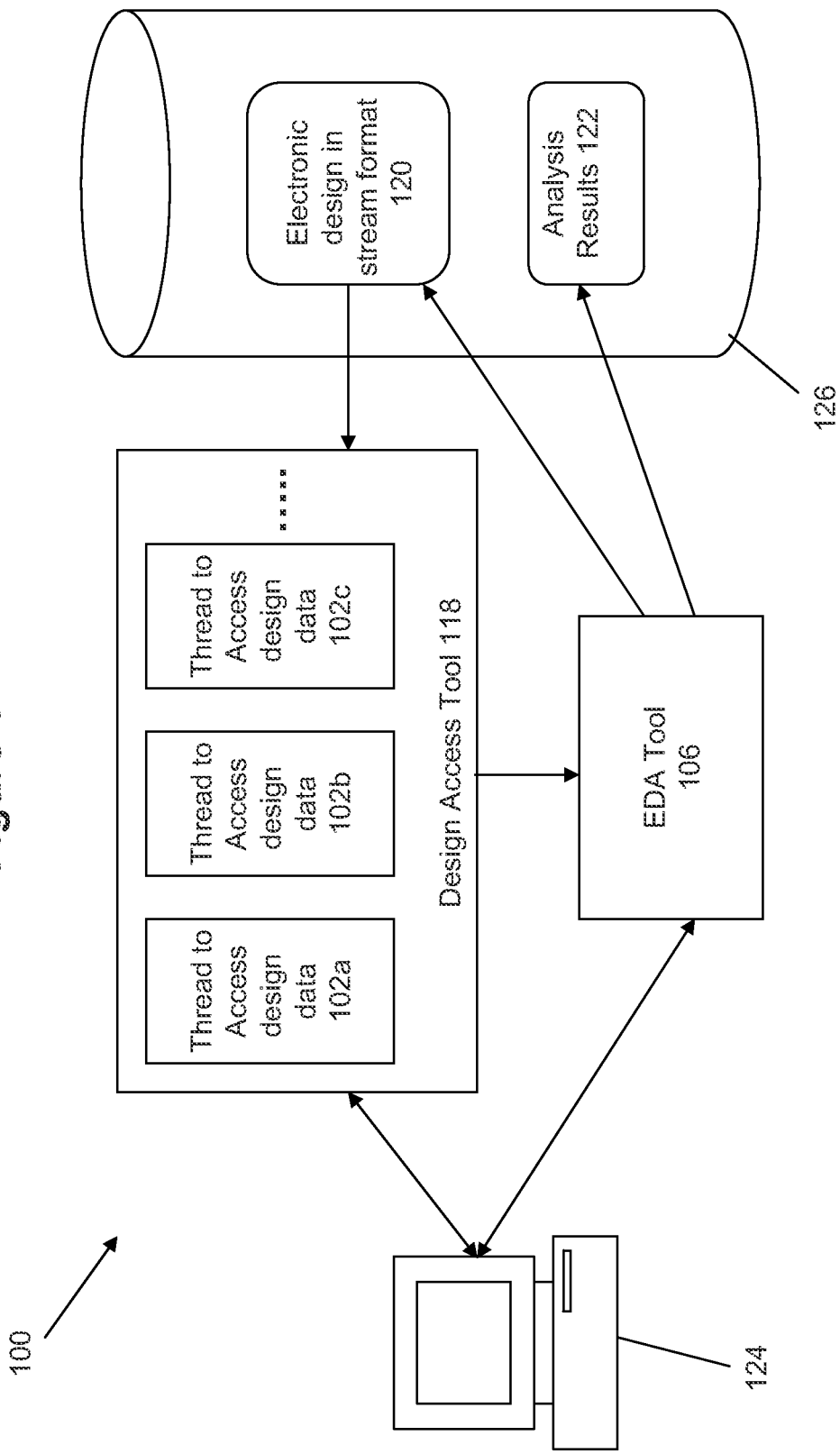
FIG. 1 illustrates an example system 100 which may be employed in some embodiments of the invention to allow efficient access to stream data.

FIG. 1 illustrates an example system 100 which may be employed in some embodiments of the invention to allow efficient access to stream data. System 100 may include one or more users at one or more user stations 124 that operate the system 100 to access electronic designs 120 and to use an EDA tool 106 to verify, modify, or review the electronic design 120 that is stored in a stream format. Such users include, for example, design engineers or verification engineers. User station 124 comprises any type of computing station that may be used to operate, interface with, or implement EDA applications or devices. Examples of such user stations 124 include for example, workstations, personal computers, or remote computing terminals. User station 124 comprises a display device, such as a display monitor, for displaying processing results 122 to users at the user station 124. User station 124 also comprises input devices for user to provide operational control over the activities of system 100.

The electronic designs 120 may be stored in a computer readable storage device 126. Computer readable storage device 126 comprises any combination of hardware and/or software that allows for ready access to the data that is located at the computer readable storage device 126. For example, computer readable storage device 126 could be implemented as computer memory operatively managed by an operating system. The computer readable storage device 126 could also be implemented as an electronic database system having storage on persistent and/or non-persistent storage. According to the present embodiment, the electronic design 120 and analysis results 122 are placed into the computer readable storage device 126.

A design access tool 118 may be used by users of a user station 124 to access or read the electronic design 120 in the stream format. The design access tool 118, also referred to herein as a "reader" or "stream reader", may be a separate tool from the EDA tool 106. In an alternate embodiment, the design access tool 118 is integrated with the EDA tool 106.

According to some embodiments, the design access tool 118 uses multiprocessing approaches, e.g., concurrent or parallel processing, to read the data from the electronic design 120. Parallel processing (also referred to as parallel computing) is a form of computing in which multiple operations are carried out simultaneously, or in "parallel." Parallel computing operates on the principle that large problems can be divided into smaller ones, with each smaller problem addressed by individual processing units concurrently. Examples of systems that support parallel processing include multi-threaded processing systems, multi-CPU/processor computers, and distributed processing systems having multiple networked nodes.

The embodiments of the invention may be used in conjunction with any type of parallel processing or computing system. For example, the invention may be employed in conjunction with multi-threading, multi-CPU or multi-processor computers (such as symmetric multiprocessing or massively parallel processing systems), distributed processing systems having multiple networked nodes, multi-core computers, and grid-based computing systems. Any type of execution or processing unit may be used to implement the invention, including processing units such as threads, processes, and tasks. Illustrative examples of the invention may be described herein with respect to specific types of computing systems or processing units (e.g., threads). For example, the approach shown in FIG. 1 depicts a design access tool 118 that operates with multiple threads 102a, 102b, and 102c to read the design data 120 in parallel. It is noted, however, that the invention may be employed with any type of computing system or processing unit and is not to be limited to a specifically disclosed type of processing system or unit unless so claimed.

As noted above, embodiments of the invention increase reading performance by parallelizing reading from a storage location. The present approach according to some embodiments uses a three-phased reading mechanism that facilitates reading of the stream-based design data in parallel, where each of the phases are parallelizable and can be separated during run-time with synchronizing operations.

Figure 2:
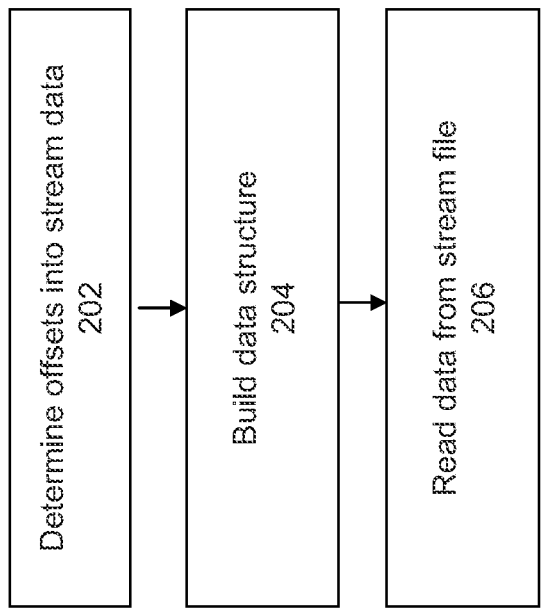
FIG. 2 shows a flowchart of a process for reading data according to the three-phased approach.

FIG. 2 shows a flowchart of a process for reading data according to a three-phased approach. This first phase 202 provides an initial set of information that facilitates the actions to be taken in the other two phases. One reason for generating this information is because when the design data is broken up into multiple portions for parallel processing, the boundaries of those portions may not necessarily coincide with the starting point within that portion for analysis. For example, the design data may be split up into multiple contiguous segments of data, but the segment boundaries may cross or divide a cell such that the first full cell within the segment may actually begin several data units from the starting point of that segment. If the analysis is to be performed on a cell basis within a segment, then the analysis tool will need to know the offset of that first cell within the segment to begin processing. For this reason, the first phase 202 may be performed to first divide the design data file into multiple segments, and to then determine offsets into the different segments for the first full cell in each segment, e.g., stream data.

The next phase 204 is performed to build the data structures that that will be used to store and reference the data elements from the design data. For example, these data structures will be constructed with respect to cell references, via instances and instance arrays. As used herein, the term "instance table" refers to any type of structure that may be used to store this information, even if the actual structure is not in a tabular format.

The third phase 206 performs the actual reading of the stream file, e.g., the GDS or OASIS file. This action is performed in parallel to populate a database that represents the design data from the stream-based file. The invention can be used to populate any kind of database. For example, the invention can be used to populate an in-memory database of an on-disk database.

Figure 3:
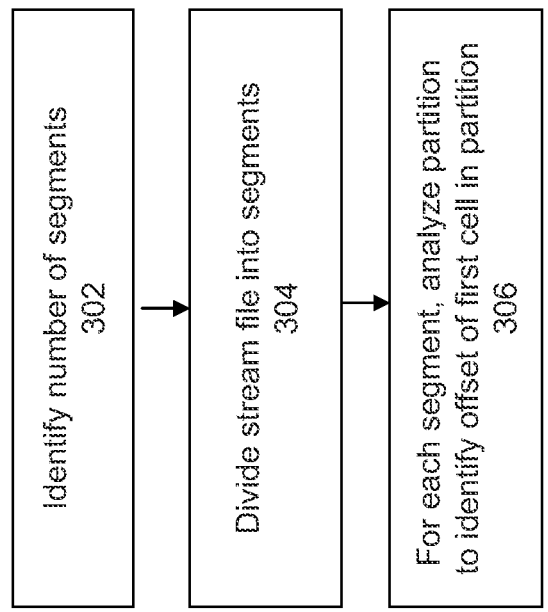
FIG. 3 illustrates a detailed flowchart of the process for the first phase of determining offsets.

FIG. 3 illustrates a detailed flowchart of the process for the first phase of determining offsets 202. At 302, the process determines the number of segments that should be partitioned from the stream file. According to one embodiment, the number of segments corresponds to the degree of parallelization that will be imposed on the read operations. In other words, if there are four threads operating upon the stream file in parallel, then the stream file will be partitioned into four segments.

In an alternate embodiment, the number of segments is selected to exceed the number of threads. One reason for this alternate approach is to facilitate load balancing, where each thread is allocated multiple segments. In this way, if any thread more quickly processes its allocated segments faster than other threads, than that thread can assume processing responsibility for unprocessed segments from another thread.

At 304, the stream file is partitioned into the different segments. According to one embodiment, the segments are equal in size. In alternate embodiment, the segments can be of different sizes. One possible way to configure segments of different sizes is by estimating the number of cells within each segment, where the size of the segments are selected to balance the number of cells and/or anticipated time of processing for each segment. One should appreciate that there could be other approaches to configuring the different segment sizes, based on the needs or requirements of the design.

Each segment is then examined at 306 to determine the address or offset of the first cell definition in that segment. According to some embodiments, this is performed for GDSII files, but is not performed for strict OASIS files that maintain an index of the contents for the file. This operation is performed by starting at the address of the beginning of the segment, and incrementally reading data from the segment until identification can be made of the beginning point of the first cell within that segment. This offset information is passed to the subsequent phases so that the subsequent phases of the process can very quickly locate the point within the segment at which data needs to be accessed. This search itself can be performed using multiple threads and usually takes a very small fraction of the time it takes to build the instance table. According to some embodiments, the search within a segment itself is not multithreaded, but multiple segments are processed in parallel using multiple threads. According to an embodiment, for non-strict or dirty OASIS files that do not maintain an index of file contents, the cell offsets may not be easy to determine except by parsing the entire input file and hence it may be difficult or impossible to build the instance table in multithreaded mode for such files.

The second phase of the present process is used to construct the instance table, by scanning over the entire stream file and storing macroscopic statistics about that stream file. The instance table is a configured data structure that is designed to store cursory information and metadata from the stream file. Since building the instance table is a pre-processing step to populating the database, the present approach provides a mechanism that very quickly builds this table, and takes only a minimal amount of memory to store the required information.

According to one embodiment, this phase is performed by reading and identification of the metadata that corresponds to the detailed data. This optimizes the subsequent loading of layout data into a design database, since it is often beneficial to have cursory information about the layout before loading it. Examples of the cursory and metadata information read from the stream file include the names of the cells, the offsets of their definitions within the stream file, the parent child relationships between cells, counts of shapes on each layer number and data type, bounding boxes of cells so on. The instance table can be saved to disk and reloaded into memory if necessary.

Figure 4:
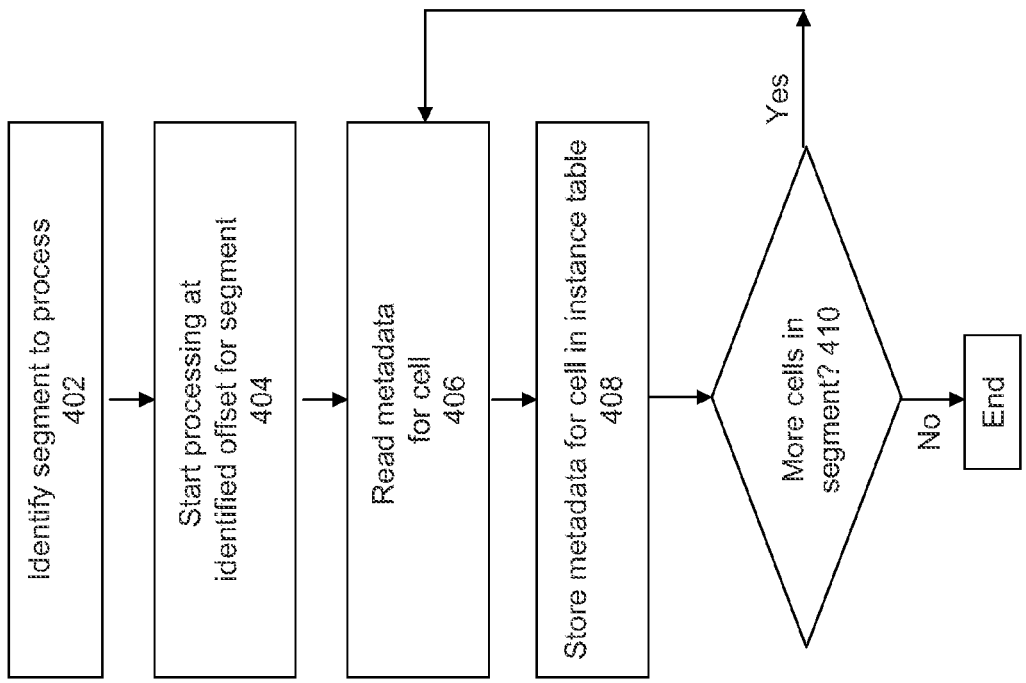
FIG. 4 shows a flowchart of a process for building the instance table according to some embodiments of the invention.

FIG. 4 shows a flowchart of a process for building the instance table according to some embodiments of the invention. At 402, the process identifies a segment to be processed by the thread. As noted above, an offset value had already been stored for each segment corresponding to the first cell in the segment. At 404, that offset value is accessed and used by the thread to begin processing from that offset location.

At 406, the cursory and metadata information is obtained for the first cell in the segment. According to one embodiment, at 408, the instance table stores for each cell its name, the offset into the input file for its definition, the orientation, offset and master for all instances in it, and the shape count and bounding box for all shapes contained in it. This is done by computing the bounding box of each shape as it is read in and updating the corresponding shape count, and storing each instance in a list of instances. Once all data has been read in, a bottom-up traversal through the design hierarchy is used to compute the bounding box of each cell in the design. Since no shape records are created, the instance table can be built quickly with a sufficiently small memory footprint.

A determination is made at 410 whether there are any additional cells in the segment under examination. If so, then the process returns to 406 to process the information for the additional cell(s).

The instance table can be built without executing the first phase if the starting offsets for cell definitions are known beforehand. This is possible for strict OASIS files since the file itself contains a table of offsets. A work unit is created for each cell which builds the record for the cell in the instance table when it runs.

The third phase of the process reads the detailed information about the cells from the stream file. Using the instance table as a guide, the data is read from the stream file and used to populate the in-memory database with shapes and instances from the stream file. This phase is the one that typically consumes the bulk of run time and memory.

Either the "producer-consumer" and "chain-of-responsibility" approaches can be used to access the stream data. In the producer-consumer approach, the producer extracts data out of the stream file and passes on the data to a generic consumer for processing. The producer consists of a format-specific stream parser that controls traversal of the file and passes the parsed data to the consumer. The consumer is application-dependent and can be set at run time. Example consumers are the class that implements the instance table, and a class that is ultimately responsible for storing data in a database.

The chain-of-responsibility approach is used to implement different kinds of filters for the data being read-in. For example, consider the use case where the user desires to load only a portion of the layout and wishes to flatten all cells that have three shapes or less. In the step of loading data from the stream file into the database, data from the producer will first get passed to a consumer that acts as an area filter, deciding whether or not data being read in is covered by the user prescribed area. If yes, the data is passed to another consumer that examines whether cell instances should be placed or flattened, and populates the database accordingly. If the data read in is not covered by the user-prescribed region, it is ignored and not passed to the second consumer.

Keeping such filters as independent objects simplifies code and allows any number of filters to be added to provide more functionality as needed.

Figure 6:
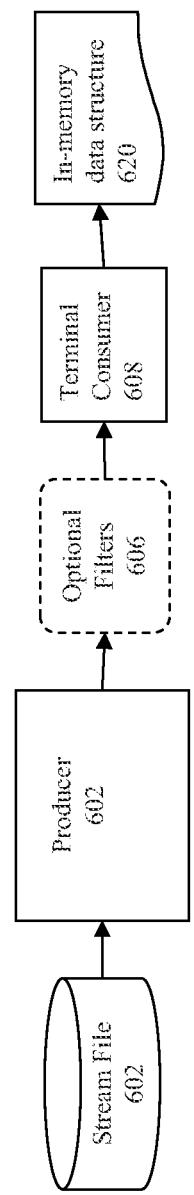
FIG. 6 illustrates a sequential approach to implement an embodiment of the invention.

Either the sequential or multi-threaded approaches can be taken to implement embodiments of the invention. In the sequential case illustrated in FIG. 6, the flow begins with an instance 604 of the producer class and terminates with an instance 608 of the consumer class that is responsible for building a data structure 620 (the instance table in one pass, and the database in another pass). The stream file 602 is accessed by the instance 604 of the producer class to read the data. Between the producer and the terminal class there will be zero or more instances 606 of the consumer class that act as filters. Unless offsets for the starting points of cell definitions are available, the entire input file is parsed by the producer. If offsets are available, only the progeny of the user-specified top cell is read in.

Figure 5:
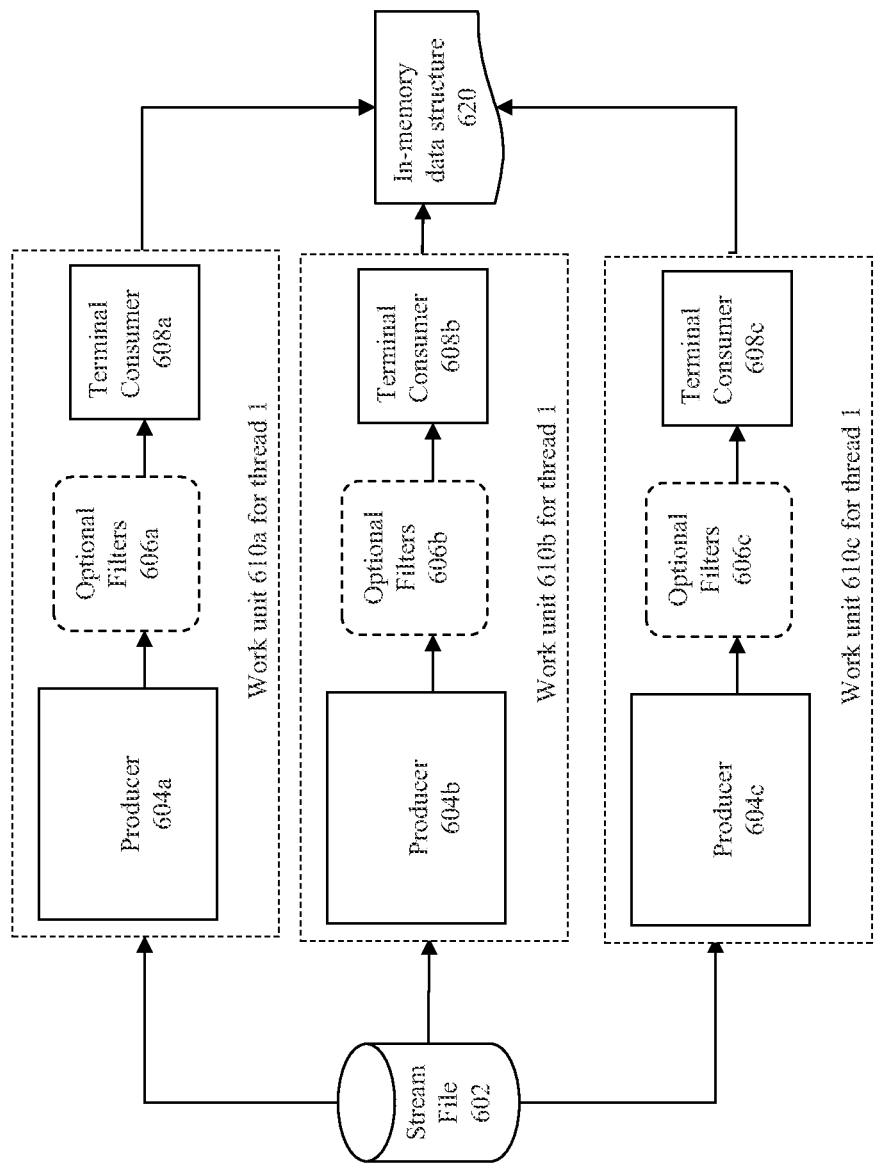
FIG. 5 illustrates a multi-threaded approach to implement an embodiment of the invention.

The flow in the multithreaded case is similar to that in the sequential case except that there are multiple producer-optional-filter-terminal-consumer chains, one for each thread, as shown in FIG. 5. In this case, the input stream file 602 is divided into a number of segments depending upon the format of the input file and the data structure to be built, e.g. as described with respect to FIG. 3. The starting offset for each segment is the beginning of a cell definition, where as the end offset is application and format dependent.

Corresponding to each file segment a "work unit" is created, which comprises of a producer-optional-filter-consumer chain as seen in FIG. 5. A work unit corresponds to a unit of computational work that can be processed by itself, without requiring synchronization or interfacing with other elements of computational work that may be concurrently executed. As shown in this figure, there are separate work units 610a, 610b, and 610c for each thread that each contains a producer instance (604a-b-c), optional filter instance (606a-b-c), and terminal consumer instance (608a-b-c). Each work unit 610 is responsible for reading the data in its file segment and populating the corresponding portion of the data structure 620 for it. All work units are placed in a "work queue".

A work queue includes work units lined up for processing in a first-in-first-out (FIFO) manner. The work queue manager manages a work queue and a set of available computational resources. A work queue manager assigns the first element from the work queue to the first available thread, and removes the work unit from the queue. Each work unit runs in the thread it is assigned to. This process continues until the work queue is empty. Once the queue is empty, all the required data has been loaded into memory.

The functioning of the work queue can be described using an illustrative example of 20,000 elements of work (e.g., 20,000 cells for which database records are to be created). Assume that the elements are to be processed in parallel using 8 threads. This is performed as follows:
1. Work units are created for the 20000 elements of work.
2. The 20000 elements are placed in a work queue for processing in a FIFO manner.
3. Resources to run 8 threads in parallel are acquired.
4. A work queue manager is created to manage the work queue and the threads.
5. The work queue manager takes the first 8 work units off the queue and assigns them one per thread to each of the 8 threads.
6. The work queue manager goes into a wait state.
7. Whenever a threads completes processing the work unit assigned to it, it tells the work queue manager.
8. The work queue manager then takes one element off the queue and assigns it to the thread that just completed.

Steps 7-8 are repeated until the work queue is empty and all threads are done processing the assigned work units.

The implementation of the work queue and work queue manager is able to handle corner cases and race conditions such as multiple threads completing their work at the same time, as well as the situation when elements are added to the work queue while the manager is removing one off the queue.

According to some embodiments, a stream reader receives the following inputs:
1. The path to the stream file.
2. The format of the stream file (i.e. GDSII or OASIS).
3. The name of the top cell to be read in.
4. The bounding box of the area (in the context of the top cell) to be loaded. If no area is specified, all data in the top cell and all of its progeny will be loaded.

One possible source of contention in shared-memory multithreaded software is the calls to system memory allocator functions (such as malloc) to allocate memory. Depending upon the platform, thread-safe implementations of memory allocation functions would perform locking of some kind, which could hamper multithreaded scalability of applications that have a lot of calls to allocate memory.

To address this issue, some embodiments use templatized page allocators, which allocate memory in pages by calling system memory allocation functions, and then assign memory to each allocation request from the pages. This reduces the number of calls to system memory allocation functions. Also, allocation of paged memory can be performed locally in each thread without locking. This results in minimal contention in memory allocation.

Since cell-level parallelism can be employed for loading data, each cell record may have allocators for objects of each type (polygons, instances, paths, rectangles and so on) so as to minimize contentions, other than those incurred in the infrequent calls to system memory allocator functions.

When building the instance table, there may be at least two sources of contention, including first a possible contention when allocating instances for each cell record. This is handled by having a page allocator for instances in each cell record.

A second type of possible contention is the system is one that creates the cell record itself. This happens because the cells in a stream file may appear in any order, and a cell may be instantiated in another cell before its definition appears in the file. For this reason, a record for a cell should be created before its definition is seen in the file. When running in multithreaded mode, race conditions may occur when a cell is instantiated in more than one cell, and work units in more than one threads attempt to create cell records for the instantiated cell. This is addressed by maintaining a cache of cell records for each thread. Whenever a record for a cell is to be created, a search is made in the cache associated with the thread. This search is local to the thread and can be performed without any locking. If the cell record is found in the cache that record is used. Otherwise, a search is made within the instance table for the cell record. This is implemented using a read-write mutex lock. First, the mutex is locked for reading and the instance table is searched for the cell record, and the read-lock is released. If a record is not found, a write lock is acquired and a new cell record is created corresponding to the cell, and the write lock is released. Pointers to records found in the main instance table are stored in the cache for each thread for future use. The use of caches reduces the need to lock, and the use of a read-write lock allows multiple threads to search the instance table simultaneously, greatly reducing contention.

There are numerous advantages to the present approaches for reading stream data. One significant advantage is the increased speed and efficiency from using a parallelized approach to reading the stream file using multiple threads.

The present approach can be used to perform selected reading of specific regions in the stream file. This is because the second pass through the stream file results in significant information being collected for the cells and instances within the electronic design. Any set of parameters or characteristics can be used to filter the design using the collected information that is used to build the instance table. As a result, only the specific portions of the details data from the stream file would need to be read in the third phase of the above process. For example, a bounding box can be drawn that encapsulates a defined region within the design. Based upon the location information for cells/instances in the design captured during the process of building the instance table, it is known which of the cells and instances are within the boundaries of the bounding box. Therefore, only those identified cells/instances need to be loaded during the third phase of the process, which is vastly more efficient than priori approaches that needed to load the whole deign in its entirety even if only a small portion of the design is of immediate interest to the user.

Therefore, the data structure described above allows for dynamic, on-demand based access to a stream file. For example, a layout browser could use the data structure described herein to load a given cell or elements of a cell only when the user decides to display the cell's contents.

System Architecture Overview

Figure 7:
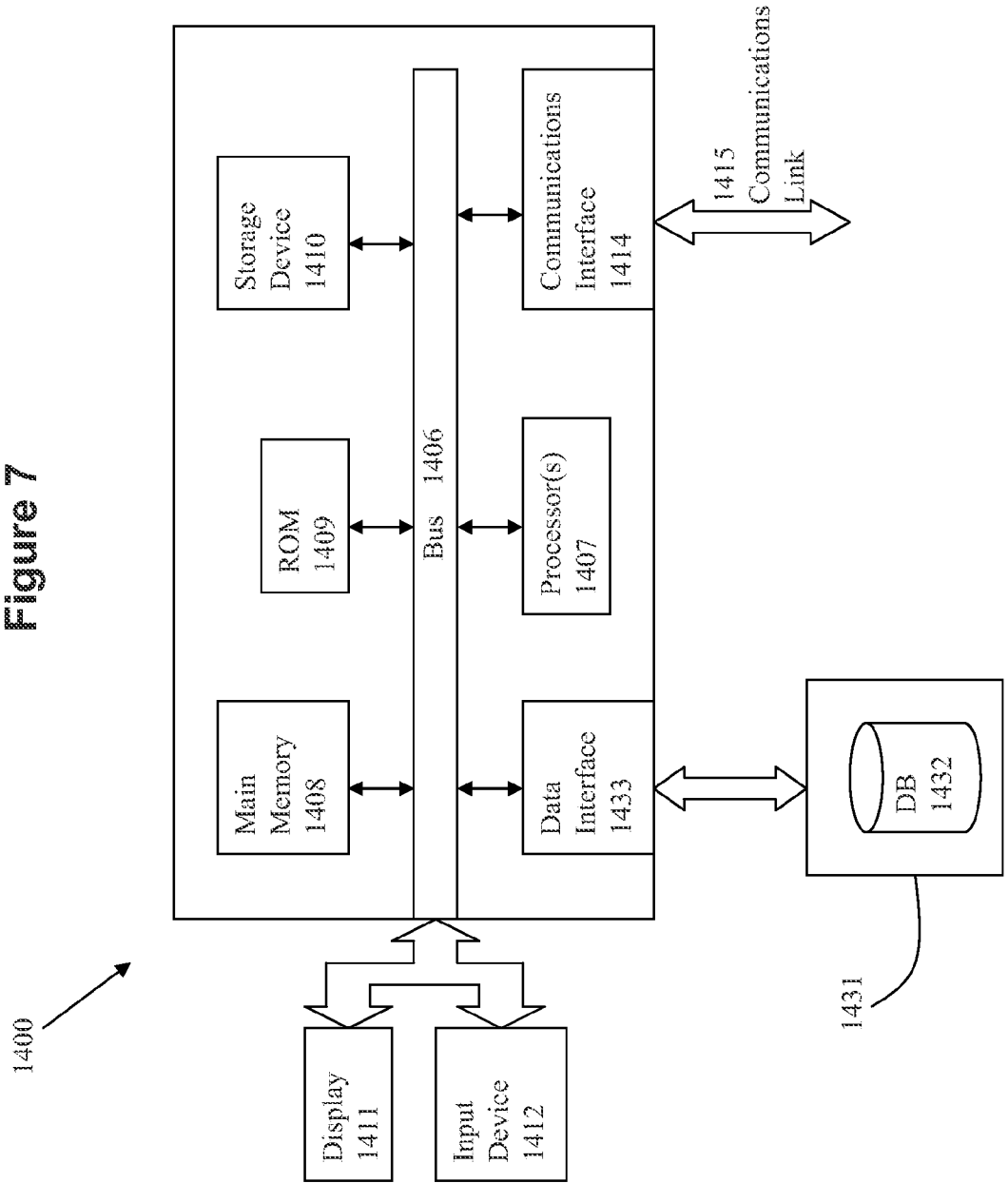
FIG. 7 illustrates an example computing architecture with which the invention may be implemented.

FIG. 7 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

The invention claimed is:

1. A computer-implemented method for accessing stream data corresponding to an electronic design, comprising:
   determining offsets corresponding to cell definitions in the stream data;
   building a data structure comprising bounding boxes for multiple cell instances in the stream data, wherein
      the stream data is partitioned into a plurality of segments based in part or in whole upon numbers of cell instances in the plurality of segments, and a boundary of at least one segment divides a cell instance of the multiple cell instances; and
   reading, by using a processor to populate a design database, the at least one segment of the stream data corresponding to a region of interest within the electronic design by at least transmitting the plurality of segments to a consumer to determine whether data in the plurality of segments is covered by the region of interest based in whole or in part upon the data structure, in which
      the at least one segment of the stream data corresponding to the region of interest is selectively read based in whole or in part upon the data structure while other data in the plurality of segments transmitted to the consumer but not corresponding to at least some of the offsets is ignored, and
      the data structure is used for deciding whether or not one or more cell instances in the at least one segment should be flattened in the design database.

2. The method of claim 1 in which parallel processing is employed to handle any or all of the process actions.

3. The method of claim 1 in which the act of determining offsets into the stream data divide the stream data into multiple segments and then determine the offsets into the different segments for a first full cell in a segment.

4. The method of claim 3, comprising:
   determining a number of the segments that should be partitioned from the stream data;
   partitioning the stream data into the different segments; and
   examining the segments to determine an address or the offset of the first cell definition in that segment.

5. The method of claim 1 in which the act of building the data structure comprises constructing the data structure with respect to cell references, via instances or instance arrays.

6. The method of claim 1 in which the act of building the data structure comprises reading and identification of the data structure that corresponds to detailed data, where the data structure corresponds to cursory information about a layout comprising names of the cells, the offsets of cell definitions within the stream data, parent child relationships between cells, counts of shapes on each layer number and data type, or the bounding boxes of the cells.

7. The method of claim 1 in which the act of building the data structure comprises
   identifying a segment to be processed by a parallel processing entity;
   using an offset value to begin processing from an offset location;
   obtaining cursory or metadata information for one or more cells in the segment.

8. The method of claim 1 in which the act of reading the data from the stream data to populate the design database with either a producer-consumer or a chain-of-responsibility approach.

9. The method of claim 8 in which one or more filters is employed to filter data being read.

10. The method of claim 1 in which the act of reading the data from the stream data to populate the design database either sequentially or with parallel processing.

11. The method of claim 10 in which the parallel processing is performed by creating multiple work units to process data for a segment, the work units are placed into work queues, and a work queue manager manages the work queue and assigns the work units to parallel processing entities to process work.

12. The method of claim 1 in which locking is implemented to facilitate thread-safe processing.

13. The method of claim 1 in which page allocators are employed to allocate memory.

14. The method of claim 1 in which a selected reading is performed of specific regions in the stream data.

15. A system for accessing stream data corresponding to an electronic design, comprising:
a processor to:
determine offsets corresponding to cell definitions in the stream data;
build a data structure comprising bounding boxes for multiple cell instances in the stream data, wherein
the stream data is partitioned into a plurality of segments based in part or in whole upon numbers of cell instances in the plurality of segments, and a boundary of at least one segment divides a cell instance of the multiple cell instances; and
read the at least one segment of the stream data corresponding to a region of interest within the electronic design by at least transmitting the plurality of segments to a consumer to determine whether data in the plurality of segments is covered by the region of interest based in whole or in part upon the data structure to populate a design database, in which
the at least one segment of the stream data corresponding to the region of interest is selectively read based in whole or in part upon the data structure while other data in the plurality of segments transmitted to the consumer but not corresponding to at least some of the offsets is ignored, and
the data structure is used for deciding whether or not one or more cell instances in the at least one segment should be flattened in the design database.

16. The system of claim 15 in which parallel processing is employed to handle any or all of the process actions.

17. The system of claim 15, in which the processor that is to determine offsets into the stream data is further to divide the stream data into multiple segments and then determine the offsets into the multiple segments for a first full cell in a segment.

18. The system of claim 15, in which the processor that is to build the data structure is further to construct the data structure with respect to cell references, via instances or instance arrays.

19. The system of claim 15, in which the processor that is to build the data structure is further to read and identify the data structure that corresponds to detailed data, where the data structure corresponds to cursory information about a layout comprising names of cells, the offsets or first offsets of cell definitions within the stream data, parent child relationships between the cells, counts of the shapes or cells on each layer number and data type, or one or more bounding boxes of the cells.

20. The system of claim 15, in which the processor that is to build the data structure is further to:
identify a segment to be processed by a parallel processing entity;
use an offset value to begin processing from an offset location; and
obtain cursory or metadata information for one or more cells in the segment.

21. The system of claim 15, in which the processor is to read the data from the stream data to populate the design database with either a producer-consumer or a chain-of-responsibility approach.

22. The system of claim 15, in which a selected reading is performed in one or more specific regions in the stream data.

23. A computer program product embodied on a non-transitory computer usable medium, the non-transitory computer readable medium having stored thereon a sequence of instructions which, when executed by a processor causes the processor to execute a method for accessing stream data corresponding to an electronic design, the method comprising:
determining offsets corresponding to cell definitions in the stream data;
building a data structure comprising bounding boxes for multiple cell instances in the stream data, wherein
the stream data is partitioned into a plurality of segments based in part or in whole upon numbers of cell instances in the plurality of segments, and a boundary of at least one segment divides a cell instance of the multiple cell instances; and
reading the at least one segment of the stream data corresponding to a region of interest within the electronic design by at least transmitting the plurality of segments to a consumer to determine whether data in the plurality of segments is covered by the region of interest based in whole or in part upon the data structure to populate a design database, in which
the at least one segment of the stream data corresponding to the region of interest is selectively read based in whole or in part upon the data structure while other data in the plurality of segments transmitted to the consumer but not corresponding to at least some of the offsets is ignored, and
the data structure is used for deciding whether or not one or more cell instances in the at least one segment should be flattened in the design database.

24. The computer program product of claim 23 in which parallel processing is employed to handle any or all of the process actions.

25. The computer program product of claim 23 in which the act of determining offsets into the stream data divide the stream data into multiple segments and then determine the offsets into the different segments for a first full cell in a segment.

26. The computer program product of claim 23 in which the act of building the data structure comprises constructing the data structure with respect to cell references, via instances or instance arrays.

27. The computer program product of claim 23 in which the act of building the data structure comprises reading and identification of the data structure that corresponds to detailed data, where the data structure corresponds to cursory information about a layout comprising names of the cells, the offsets of cell definitions within the stream data, parent child relationships between cells, counts of shapes on each layer number and data type, or bounding boxes of the cells.

28. The computer program product of claim 23 in which the act of building the data structure comprises
identifying a segment to be processed by a parallel processing entity;
using an offset value to begin processing from an offset location; and
obtaining cursory or metadata information for one or more cells in the segment.

29. The computer program product of claim 23 in which the act of reading the data from the stream data to populate the design database with either a producer-consumer or a chain-of-responsibility approach.

30. The computer program product of claim 23 in which a selected reading is performed of specific regions in the stream data.

* * * * *